(12) United States Patent
Inoue et al.

(10) Patent No.: US 6,825,132 B1
(45) Date of Patent: Nov. 30, 2004

(54) MANUFACTURING METHOD OF SEMICONDUCTOR DEVICE INCLUDING AN INSULATION FILM ON A CONDUCTIVE LAYER

(75) Inventors: Yasunori Inoue, Gifu (JP); Hideki Mizuhara, Aichi (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/228,148

(22) Filed: Jan. 11, 1999

Related U.S. Application Data

(62) Division of application No. 08/806,425, filed on Feb. 26, 1997, now Pat. No. 5,892,269.

(30) Foreign Application Priority Data

Feb. 29, 1996 (JP) ............................................. 8-43679
Jan. 27, 1997 (JP) ............................................. 9-12788

(51) Int. Cl.$^7$ ............................................. H01L 21/31
(52) U.S. Cl. ..................... 438/783; 438/624; 438/761; 438/778; 438/780; 438/637; 438/702; 438/763; 438/766; 438/787; 438/782
(58) Field of Search ............................. 438/783, 624, 438/761, 778, 780, 637, 702, 763, 766, 787, 782, 798, 758, 781, 789, 794; 257/751, 759, 760

(56) References Cited

U.S. PATENT DOCUMENTS

| | | | |
|---|---|---|---|
| 3,747,203 A | 7/1973 | Shannon | 29/578 |
| 4,668,973 A | 5/1987 | Dawson et al. | 257/634 |
| 4,676,867 A | 6/1987 | Elkins et al. | 257/752 |
| 4,775,550 A | 10/1988 | Chu et al. | 427/38 |
| 4,885,262 A | 12/1989 | Ting et al. | 437/231 |
| 4,920,071 A | 4/1990 | Thomas | |
| 4,962,052 A | 10/1990 | Asayama et al. | 437/31 |
| 4,983,546 A | 1/1991 | Hyun et al. | 437/231 |
| 4,984,055 A | 1/1991 | Okumura et al. | 257/644 |
| 5,003,062 A | 3/1991 | Yen | 437/231 |

(List continued on next page.)

FOREIGN PATENT DOCUMENTS

| | | |
|---|---|---|
| DE | 4218495 A1 | 12/1992 |
| EP | 0 602 607 A1 | 6/1994 |
| JP | 56-125844 | 10/1981 |
| JP | 62-60242 | 3/1987 |
| JP | 1-199456 | 8/1989 |

(List continued on next page.)

OTHER PUBLICATIONS

Wolf, S.; Silicon Processing for the VLSI Era; vol. 2, Lattice Press; pp. 232–233.*

(List continued on next page.)

*Primary Examiner*—George Fourson
*Assistant Examiner*—Julio J. Maldonado
(74) *Attorney, Agent, or Firm*—Westerman, Hattori, Daniels & Adrian, LLP

(57) ABSTRACT

A semiconductor device including an insulation film superior in both planarization and water resistance is obtained. In this semiconductor device, a first insulation film including impurities is formed on a conductive layer. A film is formed between the first insulation film and the conductive layer for substantially preventing impurities from entering the conductive layer. Water resistance of the first insulation film is improved since impurities are included in the first insulation film. By using an insulation film superior in planarization as the first insulation film, a first insulation film superior in both planarization and water resistance can be obtained. The film provided between the first insulation film and the conductive layer prevents the impurities of the first insulation film from entering the conductive layer. Therefore, reduction in the reliability of the conductive layer can be prevented.

10 Claims, 9 Drawing Sheets

U.S. PATENT DOCUMENTS

| | | | |
|---|---|---|---|
| 5,024,723 A | 6/1991 | Goesele et al. | 156/628 |
| 5,084,412 A | 1/1992 | Nakasaki | 437/189 |
| 5,087,589 A | 2/1992 | Chapman et al. | 437/195 |
| 5,106,787 A | 4/1992 | Yen | 437/231 |
| 5,153,680 A | 10/1992 | Naito et al. | 357/8 |
| 5,166,768 A | 11/1992 | Ito | 257/523 |
| 5,186,745 A | 2/1993 | Maniar | 106/287.16 |
| 5,192,697 A * | 3/1993 | Leong | 438/624 |
| 5,270,259 A | 12/1993 | Ito et al. | 437/235 |
| 5,310,700 A | 5/1994 | Lien et al. | 257/758 |
| 5,314,834 A | 5/1994 | Mazure et al. | 437/43 |
| 5,314,843 A | 5/1994 | Yu et al. | 437/225 |
| 5,341,026 A | 8/1994 | Harada et al. | 257/758 |
| 5,352,630 A | 10/1994 | Kim et al. | 437/195 |
| 5,373,192 A | 12/1994 | Eguchi | 257/758 |
| 5,387,812 A | 2/1995 | Forouhi et al. | 257/758 |
| 5,404,046 A | 4/1995 | Matsumoto et al. | 257/750 |
| 5,429,990 A | 7/1995 | Liu et al. | 437/190 |
| 5,459,086 A | 10/1995 | Yang | |
| 5,468,684 A | 11/1995 | Yoshimori et al. | 437/228 |
| 5,479,054 A | 12/1995 | Tottori | 257/752 |
| 5,496,776 A | 3/1996 | Chien et al. | 437/231 |
| 5,514,910 A | 5/1996 | Koyama | 257/768 |
| 5,519,254 A | 5/1996 | Tabara | 257/758 |
| 5,523,616 A | 6/1996 | Den | 257/758 |
| 5,541,445 A | 7/1996 | Quellet | |
| 5,549,786 A | 8/1996 | Jones et al. | 156/662.1 |
| 5,569,618 A | 10/1996 | Matsubara | 437/52 |
| 5,581,101 A | 12/1996 | Ning et al. | 257/347 |
| 5,607,880 A | 3/1997 | Suzuki et al. | 437/195 |
| 5,616,513 A | 4/1997 | Shepard | 438/402 |
| 5,665,845 A | 9/1997 | Allman | 528/5 |
| 5,674,784 A | 10/1997 | Jang et al. | 437/195 |
| 5,702,568 A | 12/1997 | Shin et al. | 156/644.1 |
| 5,723,895 A | 3/1998 | Takahashi | 257/499 |
| 5,753,975 A | 5/1998 | Matsuno | 257/751 |
| 5,786,273 A | 7/1998 | Hibi et al. | 438/637 |
| 5,817,582 A | 10/1998 | Maniar | 438/782 |
| 5,818,068 A | 10/1998 | Sasaki et al. | 257/59 |
| 5,830,773 A | 11/1998 | Brennan et al. | 437/67 |
| 5,855,962 A | 1/1999 | Cote et al. | 427/376.2 |
| 5,863,702 A | 1/1999 | Ohbayashi et al. | 436/270.13 |
| 5,866,476 A | 2/1999 | Choi et al. | 438/624 |
| 5,892,269 A | 4/1999 | Inoue et al. | 257/634 |
| 5,898,221 A | 4/1999 | Mizuhara et al. | 257/751 |
| 5,930,624 A | 7/1999 | Murata et al. | 438/253 |
| 5,960,321 A | 9/1999 | Hsieh et al. | 438/699 |
| 5,963,827 A | 10/1999 | Enomoto et al. | 438/629 |
| 6,001,745 A * | 12/1999 | Tu et al. | 438/782 |
| 6,013,578 A | 1/2000 | Jun | 438/687 |
| 6,071,807 A | 6/2000 | Watanabe et al. | 438/623 |
| 6,071,810 A | 6/2000 | Wada et al. | 438/635 |
| 6,136,686 A | 10/2000 | Gambino et al. | 438/624 |
| 6,153,519 A | 11/2000 | Jain et al. | 438/681 |

FOREIGN PATENT DOCUMENTS

| | | |
|---|---|---|
| JP | 1-307247 | 12/1989 |
| JP | 2-7451 | 1/1990 |
| JP | 2-26055 | 1/1990 |
| JP | 2-101532 | 8/1990 |
| JP | 2-235358 | 9/1990 |
| JP | 2-253643 | 10/1990 |
| JP | 3-101130 | 4/1991 |
| JP | 4-234149 | 8/1992 |
| JP | 4-307934 A | 10/1992 |
| JP | 4-317358 | 11/1992 |
| JP | 5-74963 | 3/1993 |
| JP | 5-198523 | 8/1993 |
| JP | 5-226334 | 9/1993 |
| JP | 6-275229 | 9/1994 |
| JP | 6-291202 | 10/1994 |
| JP | 6-349950 | 12/1994 |
| JP | 7-99195 | 4/1995 |
| JP | 8-17770 | 1/1996 |
| JP | 8-64561 | 3/1996 |
| JP | 8-241891 | 9/1996 |
| JP | 9-8949 | 1/1997 |
| JP | 9-58062 | 3/1997 |
| JP | 9-69562 | 3/1997 |
| JP | 9-246375 | 9/1997 |
| JP | 9-312339 | 12/1997 |
| JP | 63-198359 | 8/1998 |
| JP | 9-104698 | 11/1998 |
| KR | 0179563 | 11/1998 |

OTHER PUBLICATIONS

Wolf et al., "Silicon Processing for the VLSI Era: vol. 1—Process Technology", Lattice Press, 1986, p. 441.*

Wolf, "Silicon Processing for the VLSI Era: vol. 2—Process Integration", Lattice Press, 1990, pp. 232–233.*

Sze, *Physics of Semiconductor Devices,* 2nd Ed. 1981, p. 393.

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.,* vol. 33 (1994), pp. 1385–1389.

Japanese Patent Laying–Open 59–017243 (abstract).

Japanese Patent Laying–Open No. 58–031519 (abstract).

Yoshio Homma, et al., "Using Selective CMP with Low Permittivity Organic SOG to Achieve Low Capacitance Multilevel Interconnection" VMIC Catalog No. 95ISMIC–104, 1995, pp. 457–463.

Wang et al. , "A Study of Plasma Treatments on Siloxane SOB," IEEE VMIC Conference, Jun. 7–8, 1994, pp. 101–107.

Chiang et al., Defects Study on Spin on Glass Planarization Technology, IEEE VMIC Conference, Jun. 15–16, 1987, pp. 404–412.

Lai–Juh Chen, et al., "Fluorine–Implanted Treatment (FIT) SOG for the Non–Etchback Intermetal Dielectric," IEEE VMIC Conference, Jun. 7–8, 1994, pp. 81–86.

Moriya et al., "Modification Effects in Ion–Implanted $SiO_2$ Spin–on–Glass," *J. Electrochem, Soc.,* vol. 140, No. 5, May 1993, pp. 1442–1450.

Matsuura et al., "An Advanced Interlayer Dielectric System with Partially Converted Organic SOG Using Plasma Treatment," IEEE VMIC Conference, Jun. 8–9, 1993, pp. 113–115.

Ishida et al., "Mechanism for ALSiCu alloy Corrosion," *Jpn. J. Appl. Phys.,* vol. 31 (1992), pp. 2045–2048.

Doki et al., "Moisture–Blocking Mechanism of ECR–Plasma," IEEE VMIC Conference, Jun. 7–8, 1994, pp. 235–139.

Shimokawa et al., "Suppression of MOSFET hot carrier degradation by P–SiO underLayer," *The Institute of Electronics, Information and Communication Engineers,* Technical Report of IEICE, SDM92–133 (Dec. 1992), pp. 89–94.

* cited by examiner

MANUFACTURING METHOD OF SEMICONDUCTOR DEVICE INCLUDING AN INSULATION FILM ON A CONDUCTIVE LAYER

This application is a division of application Ser. No. 08/806,425, filed Feb. 26, 1997, now U.S. Pat. No. 5,892,269.

BACKGROUND OF THE INVENTION

1. Field of the Invention

The present invention relates to semiconductor devices and a manufacturing method thereof, and more particularly, to a semiconductor device having an insulation film on a conductive layer, and a manufacturing method thereof.

2. Description of the Background Art

Reducing the size of interconnections and providing multilayers thereof are now required to further increase the integration density of semiconductor integrated circuit devices. It is necessary to insert an interlayer insulation layer between each interconnection to provide a multilayer structure of the interconnections. If the surface of this interlayer insulation layer is not planar, a stepped portion will be generated at the interconnection formed above the interlayer insulation film. This causes defects such as disconnection.

Therefore, the surface of the interlayer insulation film (the surface of the device) must be made as flat as possible. The technique to planarize the surface of the device is called planarization. This planarization technique has become important in reducing the size and providing multilayers of the interconnection.

An SOG (Spin On Glass) film is known as an interlayer insulation film commonly used in planarization. Research of this SOG film is particularly in progress in the planarization technology taking advantage of fluidity of the material of the interlayer insulation film.

An "SOG film" is a generic term of a film mainly composed of a solution in which a silicon compound is dissolved in an organic solvent, and silicon dioxide ($SiO_2$) formed from that solution.

In forming an SOG film, first a solution having a silicon compound dissolved in an organic solvent is applied on a substrate in droplets. The substrate is rotated. By this rotation, the solution coating is provided on the substrate formed of interconnections so as to alleviate the stepped portion thereon. More specifically, the coating is formed thick at the concave portion and thin at the convex portion on the substrate. Thus, the solution coating is planarized at the surface.

Heat treatment is then applied to vaporize the organic solvent. Also, polymerization proceeds to result in a planarized SOG film at the surface.

An SOG film is typically classified into an inorganic SOG film that does not include any organic component of a silicon compound, as represented by the following general formula (1), and an organic SOG film including an organic component in a silicon compound, as represented by the following general formula (2).

  (1)

  (2)

(n, X, Y: integer; R: alkyl group or aryl group)

Inorganic SOG contains a great amount of moisture and a hydroxyl group. The inorganic SOG has a disadvantage that it is more brittle than a silicon oxide film formed by CVD (Chemical Vapor Deposition). For example, a crack is easily generated during heat treatment in an inorganic SOG film when thicker than 0.5 μm.

In contrast, an organic SOG film has the generation of a crack during heat treatment suppressed. The organic SOG film can be formed having a thickness of approximately 0.5–1.0 μm. The usage of an organic SOG film allows the formation of an interlayer insulation film that is greater in film thickness. Therefore, sufficient planarization can be achieved for even a great stepped portion on a substrate.

Although superior in planarization, an inorganic SOG film may adversely affect the metal interconnection and the like since it contains a great amount of moisture and a hydroxyl group. There is a possibility of degradation in the electric characteristics, corrosion, and the like. This problem may similarly be encountered in an organic SOG film including, though smaller in amount than the inorganic SOG film, moisture and a hydroxyl group.

Therefore, when an SOG film is employed as an interlayer insulation film, an insulation film such as a silicon oxide film formed by plasma CVD, for example, having the property of blocking moisture and hydroxyl groups as well as having high insulation and mechanical strength is generally provided above or below the SOG film.

A silicon oxide film formed by plasma CVD is superior in water resistance than an SOG film. However, it was conventionally difficult to obtain satisfactory water resistance effect even when a silicon oxide film formed by plasma CVD is applied. It was therefore difficult to improve reliability of a semiconductor device such as insulation characteristics while also improving planarization in conventional art.

SUMMARY OF THE INVENTION

An object of the present invention is to improve planarization as well as reliability of a semiconductor device.

Another object of the present invention is to achieve superior planarization and insulation characteristics in a semiconductor device.

A further object of the present invention is to easily manufacture a semiconductor device superior in planarization and insulation characteristics in a manufacturing method of a semiconductor device.

According to an aspect of the present invention, a semiconductor device includes a first insulation film, and a film for substantially preventing intrusion of impurities into a conductive layer. The first insulation film is formed on the conductive layer, and includes impurities. The film preventing intrusion is formed between the first insulation film and the conductive layer. By forming the first insulation film including impurities on the conductive layer, the first insulation film is modified to have the moisture and the hydroxyl group reduced. The first insulation film becomes less hygroscopic. Therefore, the water resistant ability of the first insulation film is improved. By using an SOG film, for example, as the first insulation film, both planarization and water resistance can be improved. Furthermore, the provision of a film between the first insulation film and the conductive layer effectively prevents the impurities of the first insulation film from entering the conductive layer. The disadvantage of a shorter electromigration lifetime of the conductive layer before disconnection due to intrusion of the impurities of the first insulation layer into the conductive layer can be prevented. The film for preventing intrusion can include at least one material selected from the group consisting of silicon oxide, silicon nitride, Ti, TiN, W, $WN_X$ and TiW. A second insulation film may be included between the first insulation film and the conductive layer. The second insulation film can be formed to include a film that is less hygroscopic than the first insulation film. Also, the first insulation film may include silicon oxide containing at least 1% of C (carbon). The first insulation film may further include an inorganic SOG film. The impurities may include at least one element selected from the group consisting of argon, boron, nitrogen, and phosphorus. The upper surface of the first insulation film may be planarized.

According to a method of manufacturing a semiconductor device of another aspect of the present invention, a first insulation film is formed on a conductive layer on a substrate. Impurities are introduced into the first insulation film. Prior to formation of the first insulation film, a film for preventing intrusion of impurities of the first insulation film into the conductive layer is formed on the conductive layer. According to the manufacturing method of a semiconductor device of the present aspect, first insulation film is modified by introducing impurities into the first insulation film. As a result, the moisture and the hydroxyl group included in the first insulation film are reduced. The first insulation film is now less hygroscopic. Thus, a first insulation film superior in water resistance can be obtained. By using an SOG film as the first insulation film, planarization is also improved. Thus, a semiconductor device that can be improved both in planarization and water resistance can be manufactured. By providing a film between the conductive layer and the first insulation film, intrusion of impurities from the first insulation film into the conductive layer can be prevented effectively. Therefore, the disadvantage of the impurities entering the conductive layer to adversely affect the lifetime thereof can be prevented. The film for preventing intrusion can be formed including at least one material selected from the group consisting of silicon oxide, silicon nitride, Ti, TiN, W, $WN_X$ and TiW. In the above-described structure, a step can be included of forming a second insulation film on the conductive layer and the film preventing intrusion prior to the step of forming the first insulation film. In this case, the second insulation film can include a film less hygroscopic than the first insulation film. Also, a step can be included of forming a third insulation film on the first insulation film after the step of implanting impurities into the first insulation film. The first insulation film can include silicon oxide consisting at least 1% of C, or an inorganic SOG film. Impurities can be introduced by ion implantation. The impurities can include at least one element selected from the group consisting of argon, boron, nitrogen, and phosphorus.

In a method of manufacturing a semiconductor device according to a further aspect of the present invention, a conductive layer is formed on a substrate. On the conductive layer, a film is provided including at least 1 material selected from the group consisting of silicon oxide, silicon nitride, Ti, TiN, W, $WN_X$ and Tiw for substantially preventing intrusion of impurities implanted from above of the conductive layer into the conductive layer. The conductive layer and the intrusion prevention film are patterned. A first insulation film is formed on the patterned conductive layer and intrusion prevention film. Impurities are implanted into the first insulation film. This implantation of impurities into the first insulation film on the patterned conductive layer provides the advantage of improving the water resistance of the first insulation film. The provision of the intrusion prevention film on the conductive layer prevents intrusion of impurities into the conductive layer even when impurities are implanted into the first insulation film. The problem of a shorter electromigration lifetime for the conductive layer (a Shorter Mean Time To Failure) caused by intrusion of the impurities into the conductive layer can be eliminated. Furthermore, planarization of the first insulation film is improved by employing an SOG film, for example, as the first insulation film. Thus, a semiconductor device can easily be manufactured that allows improvement of both planarization and water resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

Figure 1:
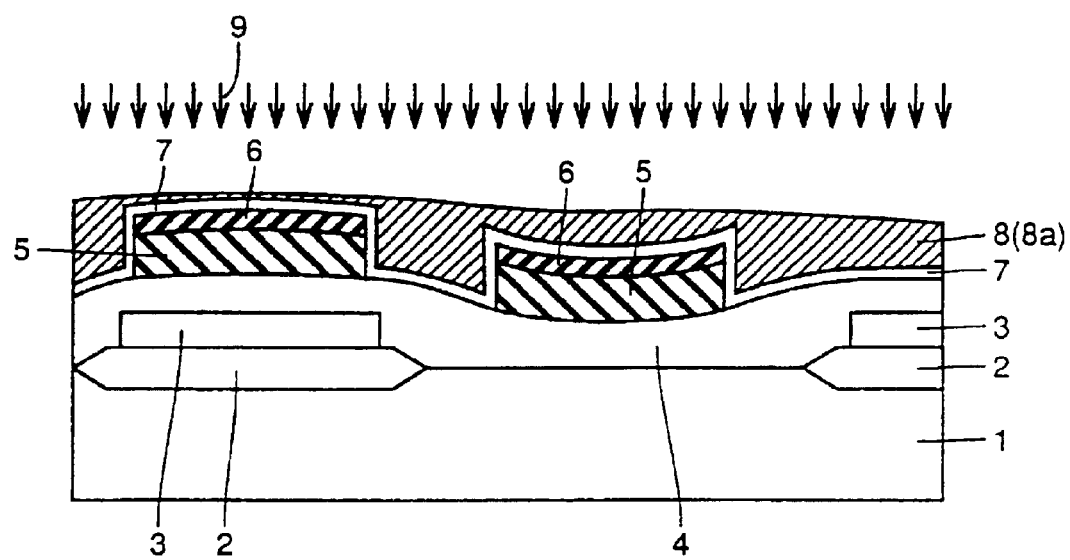
FIG. 1 is a sectional view of a semiconductor device according to an embodiment of the present invention.

Referring to FIG. 1, a semiconductor device according to an embodiment of the present invention has a LOCOS (Local Oxidation of Silicon) film 2 for element isolation formed at a predetermined region on a main surface of a silicon substrate 1. A gate electrode 3 is formed on the main surface of the silicon substrate 1. A silicon oxide film 4 is formed so as to cover LOCOS film 2, gate electrode 3, and the surface of silicon substrate 1. A patterned metal interconnection 5 is formed on silicon oxide film 4 with a predetermined distance. A spacer 6 is formed on the upper surface of metal interconnection 5. A silicon oxide film 7 is formed so as to cover silicon oxide film 4, metal interconnection 5, and spacer 6. An organic SOG film 8 is formed on silicon oxide film 7. Argon ions ($Ar^+$) 9 are implanted at a predetermined portion of organic SOG film 8. The portion of organic SOG film 8 where argon ions 9 are implanted is modified into an SOG film that does not include any organic component and that includes only a slight amount of moisture and hydroxyl group (referred to as "modified SOG film" hereinafter) 8a.

In the present embodiment, organic SOG film 8 can be modified partially or completely into modified SOG film 8a by implanting argon ions ($Ar^+$) 9 which is one type of impurities into organic SOG film 8 superior in planarization. Thus, planarization and water resistance can both be improved. Furthermore, by providing spacer 6 between metal interconnection 5 and organic SOG film 8a into which argon ions are implanted, the argon ions cannot enter metal interconnection 5 even when argon ions 9 are implanted into organic SOG film 8. Thus, the disadvantage that the lifetime of metal interconnection 5 up to disconnection caused by intrusion of impurities such as argon ions into metal interconnection 5 can be prevented. This issue will be described in details afterwards.

The manufacturing process of the semiconductor device of FIG. 1 (steps 1–8) will be described hereinafter with reference to FIGS. 2–9.

Figure 2:
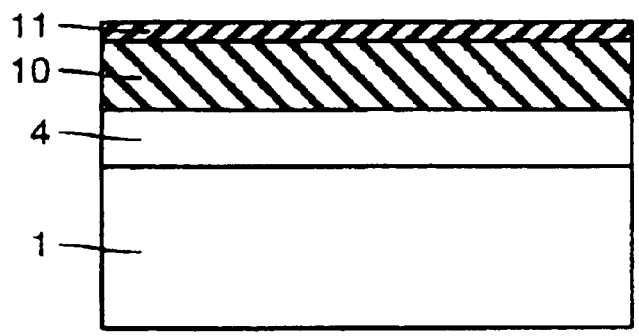
FIGS. 2–9 are sectional views of a semiconductor device of FIG. 1 for describing the manufacturing process.

According to the first step of FIG. 2, silicon oxide film 4 is formed approximately 300–800 nm in thickness on the surface of a p type single crystalline silicon substrate 1 having the plane orientation of (100). This silicon oxide film 4 is formed so as to cover the gate electrode (not shown) and the like on silicon substrate 1. Silicon oxide film 4 can be formed by various methods such as oxidation, CVD, or PVD.

A metal interconnection layer 10 is formed on silicon oxide film 4 by magnetron sputtering. Metal interconnection layer 10 has a stacked layer structure of TiN (film thickness 20 nm)/Ti (film thickness 30 nm)/AlSiCu alloy (film thickness 500 nm)/TiN (film thickness 100 nm)/Ti (film thickness 50 nm) in the downward direction.

A silicon oxide film 11 of approximately 200 nm in film thickness is formed on metal interconnection layer 10 by plasma CVD. The gas used in plasma CVD includes monosilane and nitrous oxide ($SiH_4+N_2O$), monosilane and oxygen ($SiH_4+O_2$), TEOS (Tetra-Ethoxy-Silane: $Si(OC_2H_5)_4$) and oxygen ($TEOS+O_2$). The film growth temperature is 300–500° C. The film thickness of silicon oxide film 11 depends upon the underlying stepped portion.

Figure 3:
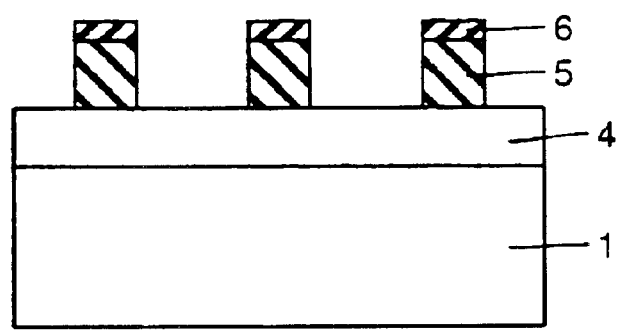

The second manufacturing step will be described with reference to FIG. 3. Silicon oxide film 11 and metal interconnection layer 10 are etched simultaneously using the same photo resist mask (not shown). Accordingly, metal interconnection layer 10 and silicon oxide film 11 are formed as a metal interconnection 5 and a spacer 6, respectively. The etching process is carried out by, for example, reactive ion etching (RIE). Silicon oxide film 11 is etched using a gas including fluorine type gas ($CF_4$, $CHF_3$, and the like). Metal interconnection layer 10 is etched using a gas including chlorine type gas ($Cl_2$, $BCl_3$, and the like).

Figure 4:
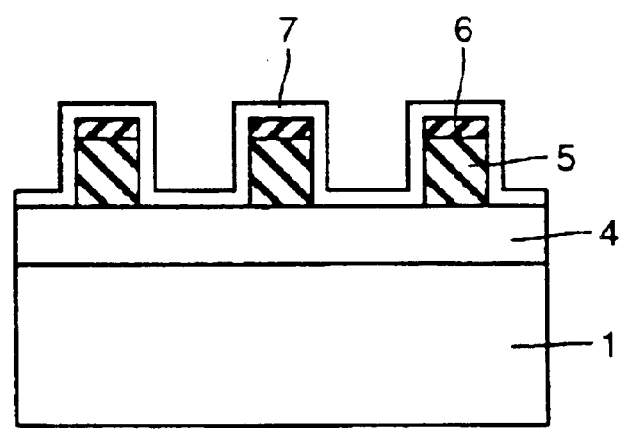

In the third step shown in FIG. 4, silicon oxide film 7 is formed approximately 300 nm in thickness by plasma CVD on the surface of the device formed by the previous second step. The film growth conditions of silicon oxide film 7 are similar to those of silicon oxide film 11.

Figure 5:
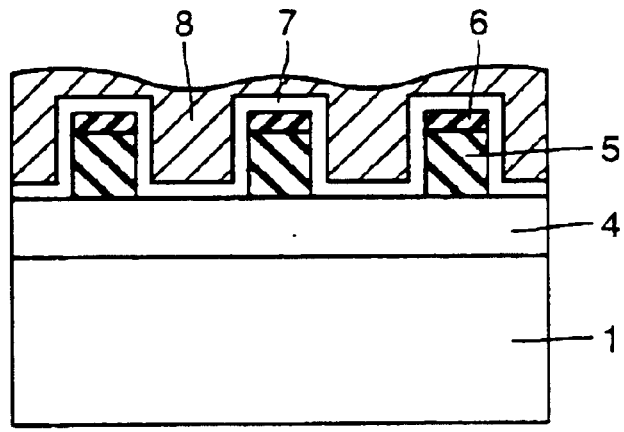

At the fourth step shown in FIG. 5, organic SOG film 8 is formed on silicon oxide film 7. The composition of organic SOG film 8 is [$CH_3Si(OH)_3$]. Organic SOG film 8 has a thickness of approximately 400 nm when there is no under layer pattern.

Organic SOG film 8 is formed as follows. First, an alcohol type solution of silicon compound of the above-described composition (for example, IPA+acetone) is applied on silicon substrate 1 in droplets. The substrate is rotated for 20 seconds at the rotary speed of 2300 rpm. As a result, a coating of alcohol type solution is formed on silicon substrate 1. This alcohol type solution coating is formed to alleviate the stepped portion on silicon substrate 1 by being formed thick at the concave portion and thin at the convex portion. As a result, the surface of the alcohol solution coating is planarized.

Then, in an atmosphere of nitrogen, a heat treatment is sequentially applied for 1 minute at 100° C., for 1 minute at 200° C., for 1 minute at 300° C., for 1 minute at 222° C., and for 30 minutes at 300° C. By this sequential heat treatment, the alcohol system is vaporized and polymerization proceeds. An organic SOG film is formed having a planarized surface of approximately 200 nm in thickness. By repeating the process starting from the coating formation to the heat treatment once more, organic SOG film 8 having a film thickness of approximately 400 nm is obtained. At least 1% of C (carbon) is contained in organic SOG film 8 formed as described above.

Figure 6:
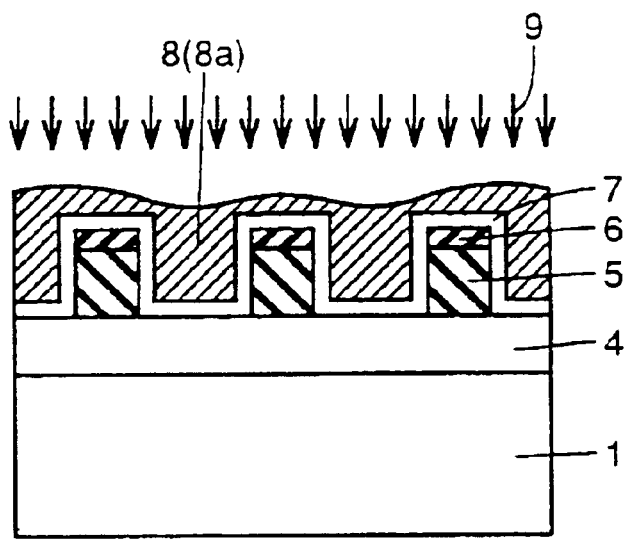

At the fifth step shown in FIG. 6, argon ions ($Ar^+$) are doped into organic SOG film 8 by ion implantation. This implantation of impurity ions into the organic SOG film causes decomposition of the organic component in organic SOG film 8 as well as reduction of the moisture and the hydroxyl group included therein. As a result, the portion of organic SOG film 8 where impurity ions are implanted is modified into SOG film 8a that does not include any organic component and that includes only a slight amount of moisture and hydroxyl group.

Since the SOG film is employed as an interlayer insulation film of the interconnections here, there is a case where a via hole opening the upper portion of metal interconnection 5 is formed in this SOG film by dry etching at a subsequent step. When an SOG film that does not have ions implanted is dry etched, the surface exposed to etching is highly hygroscopic, resulting in increase in the amount of moisture and hydroxyl group at the area exposed to etching. This increase of moisture at the area exposed to etching in an SOG film (the inner surface of the via hole) causes the disadvantage of corrosion of the upper metal interconnection connected to metal interconnection 5 through the via hole.

The side surface portion of metal interconnection 5 is still covered with silicon oxide film 7 even after formation of the via hole. This means that the side surface of metal interconnection 5 is isolated from the moisture and hydroxyl group included in the SOG film by silicon oxide film 7. Therefore, modification of organic SOG film 8 at least at the region located on the upper surface of metal interconnection 5 becomes critical in the present embodiment.

In view of the foregoing, the conditions of ion implantation must be set so that the thickest portion of the organic SOG film deposited on the upper surface of metal interconnection layer 5 is sufficiently modified. An acceleration energy of 140 KeV and dosage of $1\times10^{15}/cm^2$ are employed as the ion implantation conditions here.

Figure 16:
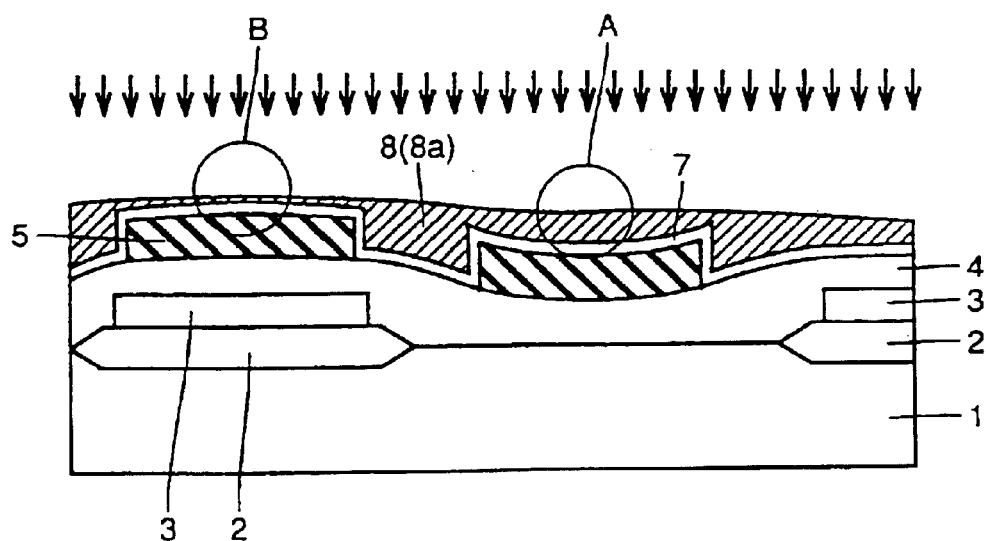
FIG. 16 is a sectional view of the structure of a semiconductor device where a spacer is omitted from the structure shown in FIG. 1 in order to describe effects of the spacer.

For the sake of simplifying the description, metal interconnection 5 is formed on an underlayer that is completely planer in FIGS. 2–9. However in practice, the unevenness caused by each element formed on silicon substrate 1 affects silicon oxide film 4 in the semiconductor process. As a result, metal interconnection 5 is not actually formed on a completely planer surface. More specifically, metal interconnection 5 is formed on an underlying interlayer insulation film (silicon oxide film 4) that has an uneven surface as shown in FIG. 1. When there is no spacer 6 in the structure of FIG. 1, the structure of FIG. 16 is achieved. In the structure of FIG. 16, the film thickness of organic SOG film 8 (portion A) on the upper surface of metal interconnection 5 formed on an underlying concave surface differs from the film thickness of organic SOG film 8 (portion B) on the upper surface of metal interconnection 5 formed on an underlying convex surface. If ions are implanted under the condition for improving the film property of portion A, the ions will be implanted through inorganic SOG film 8 and silicon oxide film 7 at portion B to arrive at metal interconnection 5. This is undesirable since the reliability of metal interconnection 5 is degraded. This problem will be described in details hereinafter.

Figure 10:
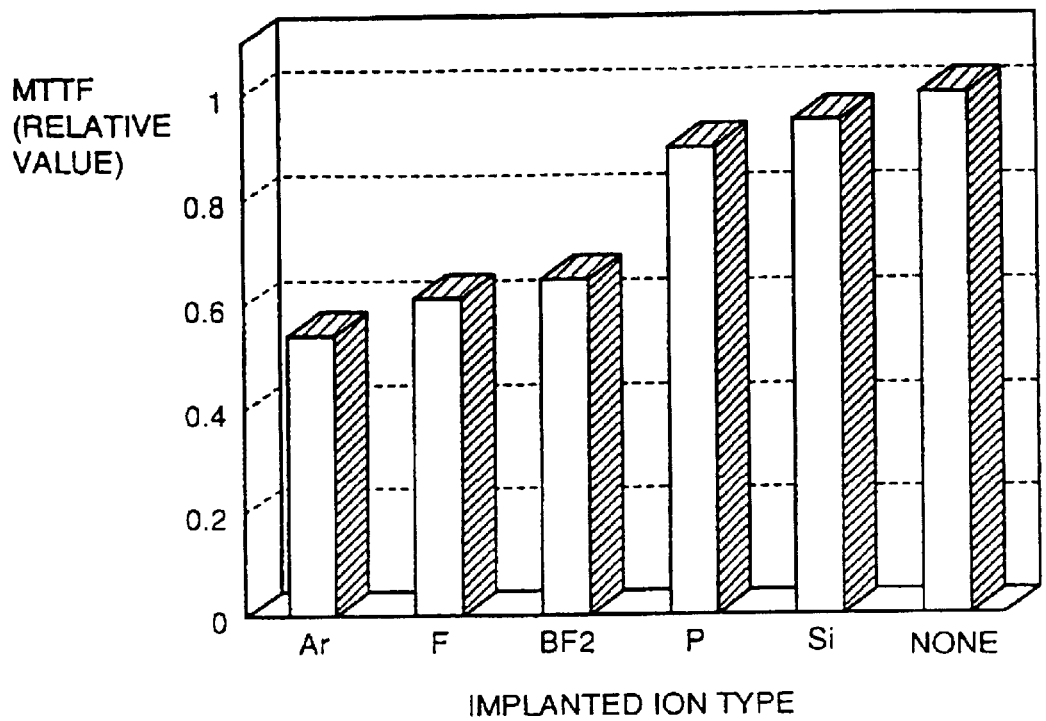
FIGS. 10–15 are diagrams of characteristics for describing the embodiment of the present invention.

FIG. 10 shows the measured results of the average time for disconnection of a metal wiring formed of a stacked layer structure of TiN/Ti/AlSiCu/TiN/Ti when various ions are implanted. Measurement was carried out under the conditions of a current density of $3\times10^6 A/cm^2$, a substrate temperature of 250° C., an interconnection width of 4 $\mu$m, and an interconnection length of 1000 $\mu$m. The absolute value was obtained with the measured value of the interconnection with no ions implanted as 1.

It is appreciated from FIG. 10 that the average time for disconnection becomes shorter by implanting ions into the AlSiCu alloy layer in the interconnection. The result was particularly significant when argon (Ar), fluorine (F), and boron fluoride ($BF_2$) is used.

It is generally difficult to fill the silicon oxide film with no gaps where the spacing between interconnections is small since the step coverage of a silicon oxide film formed by plasma CVD is limited. There is a disadvantage that a void is generated in this spacing to adversely affect the reliability of the element.

An approach can be considered to prevent impurity ions from arriving at metal interconnection 5 by providing a thick silicon oxide film 7. However, there is a possibility that a void will be formed after formation of silicon oxide film 7 or organic SOG film 8 when the spacing between metal interconnection 5 is small if silicon oxide film 7 is made too thick. There is a disadvantage that increasing the thickness of silicon oxide film 7 does not commensurate with the rule of reducing the size of the interconnection.

In the present embodiment, spacer 6 is provided on the upper surface of metal interconnection layer 5 instead of increasing the thickness of silicon oxide film 7. Spacer 6 effectively prevents the impurity ions from arriving at the AlSiCu alloy layer of metal interconnection 5 where the upper film of organic SOG film 8 is thin (refer to portion B in FIG. 16) even when ion implantation is set as one of the conditions for modifying organic SOG film 8 of a great thickness.

The portion of organic SOG film 8 located at the side surface of metal interconnection 5 does not necessarily have to be modified since the side surface of metal interconnection 5 is covered with silicon oxide film 7. However, this portion of organic SOG film 8 may be modified.

Figure 7:
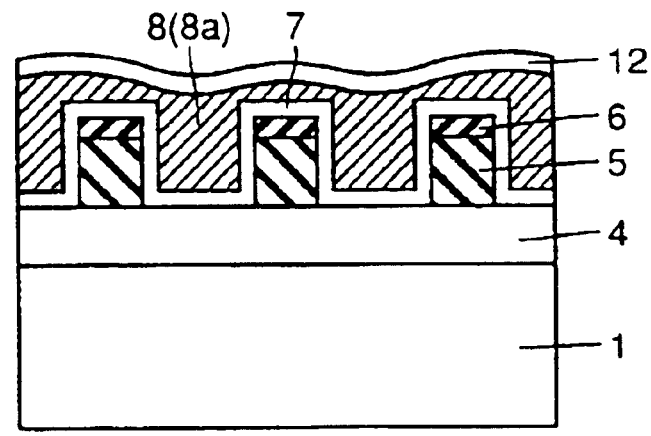

At the sixth step shown in FIG. 7, silicon oxide film 12 of approximately 200 μm in thickness is formed on modified SOG film 8a by plasma CVI). The formation conditions of silicon oxide film 12 are similar to those of the above-described silicon oxide films 7 and 11.

Figure 8:
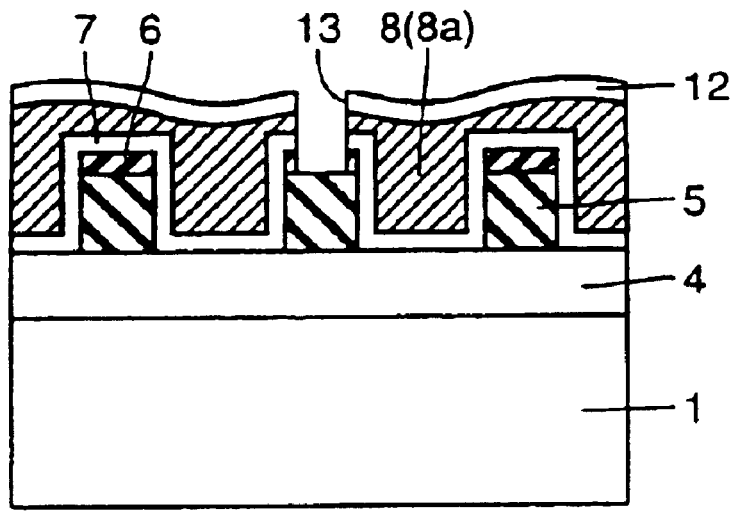

At the seventh step shown in FIG. 8, anisotropic etching is carried out using mixture gas of carbon tetrafluoride and hydrogen as etching gas to form a via hole 13 connecting with metal interconnection 5.

Figure 9:
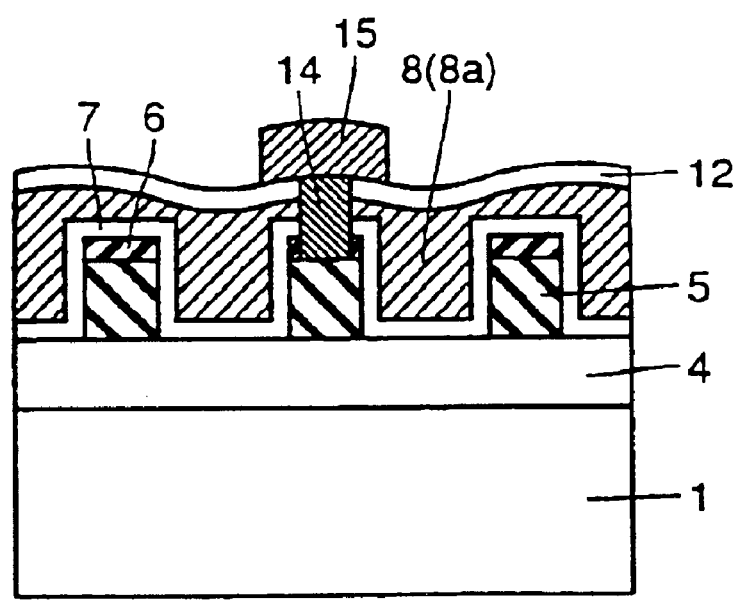

At the eighth step, the interior of via hole 13 is cleaned by sputter etching using inert gas (such as Ar). A TiN/Ti is deposited on a silicon oxide (not shown). Then, a tungsten (W) film (not shown) is formed on TiN and in via hole 13 by blanket tungsten CVD. By etching back this tungsten film until the silicon oxide film is exposed, a tungsten plug 14 as shown in FIG. 9 is formed within via hole 13.

Then, an Al alloy film (Al—Si(1%)—Cu(0.5%)) (film thickness 500 nm), a Ti film (film thickness 50 nm) and a TiN film (film thickness 20 nm) are sequentially formed upwards within via hole 13 and on silicon oxide film 12 by magnetron sputtering. Using the general lithography and dry etching method (such as RIE), a resist (not shown) is applied, exposed, and etched. The aluminum alloy film, the Ti film and the TiN film are patterned to a predetermined configuration to form upper layer metal interconnection 15. Thus, metal interconnection 5 and upper layer metal interconnection 15 are electrically connected through tungsten plug 14.

Figure 11:
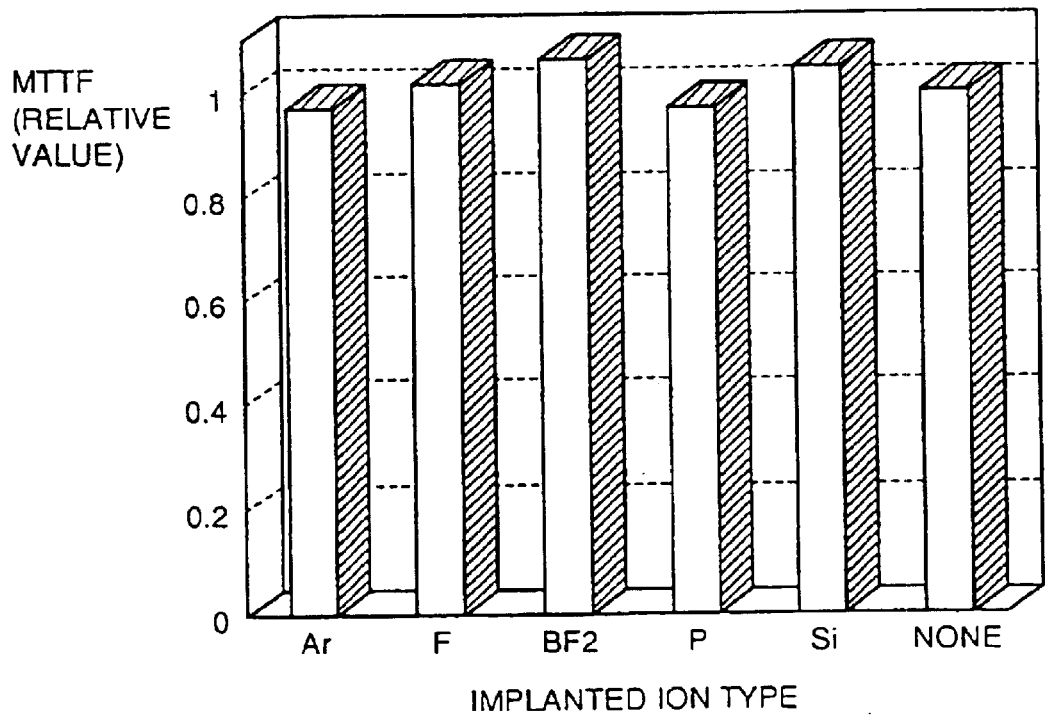

FIG. 11 shows the result of an experiment carried out employing the structure using spacer 6 of the present embodiment under the conditions similar to those of FIG. 10. It is appreciated from FIG. 11 that the average time for disconnection of metal interconnection 5 is not shortened even when the step of implanting ions into organic SOG film 8 is employed. This means that the reliability of metal interconnection 5 is not degraded even when impurities are implanted into organic SOG film 8 by virtue of spacer 6.

Since silicon oxide film 7 formed by plasma CVD can be as thin as possible by the provision of spacer 6, the spacing can easily be filled with silicon oxide film 7 even when the interconnection interval is reduced. This means that generation of a void is obviated.

Figure 15:
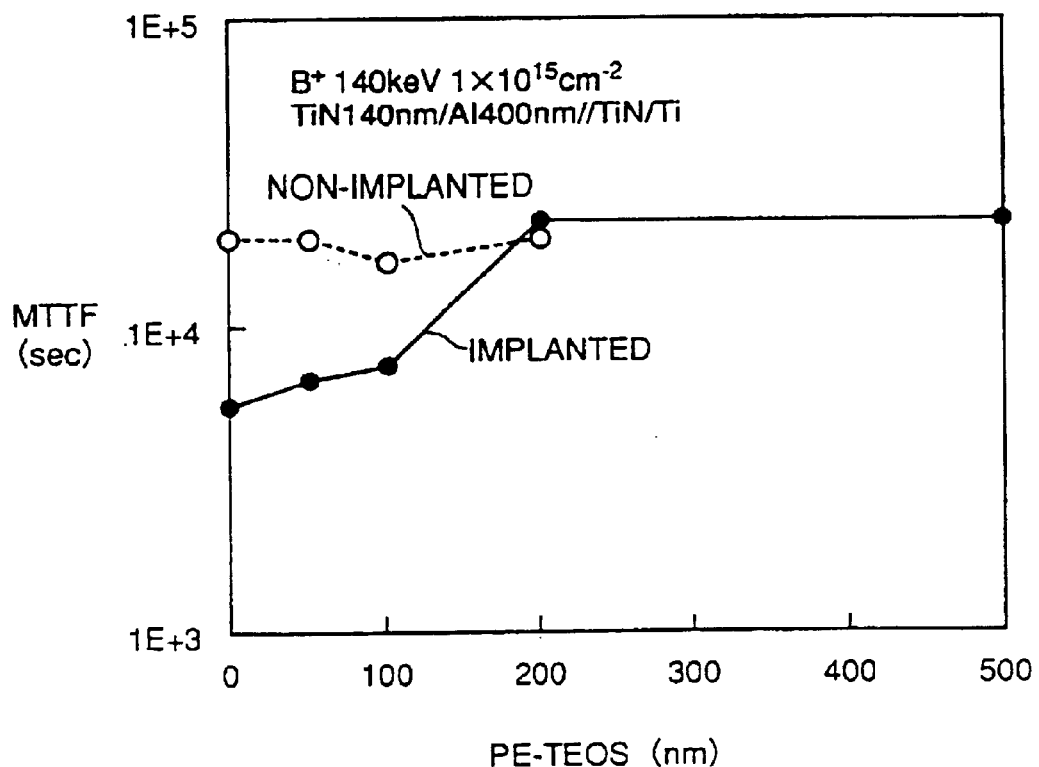

FIG. 15 shows the results of an experiment carried out to verify whether there is change in the ion intrusion prevention effect of the interconnection by provision of spacer 6.

As a specimen, a plasma TEOS oxide film (PE-TEOS) of a substance identical to that of spacer 6 is formed on the interconnection of a TiN (film thickness 140 nm)/Al (film thickness 400 nm)/TiN/Ti structure. Boron ions are implanted into this PE-TEOS under the conditions of an acceleration energy of 140 KeV and dosage of $1 \times 10^{15}/cm^2$.

The MTTF (Mean Time To Failure) of the interconnection (average lifetime) with various film thicknesses of PE-TEOS was measured. The measurement was carried out at a current density of $3 \times 10^{16} A/cm^2$ and a substrate temperature of 250° C.

It is appreciated from FIG. 15 that the MTTF of the interconnection is increased as PE-TEOS becomes thicker. This means that the PE-TEOS (spacer 6) is effective for preventing intrusion of ions, proportional to increase of the film thickness of spacer 6. The value of MTTF shows no more change when the film thickness of PE-TEOS becomes greater than 200 nm. This is because intrusion of ions is effectively inhibited when the film thickness is greater than 200 nm.

In the present embodiment, an interlayer insulation film of a three-layered structure of silicon oxide film 7, modified SOG film 8a and silicon oxide film 12 is employed for the purpose of further improving the insulation and the mechanical strength of the entire interlayer insulation film. The reason thereof will be described hereinafter.

In general, a silicon oxide film formed by plasma CVD is less hygroscopic and more water resistant than an organic SOG film. However, there is a phenomenon that the hygroscopic property is slightly increased by implanting ions into the silicon oxide film. It is to be noted that the silicon oxide film is significantly less hygroscopic than the organic SOG film, even if slightly increased. The fact that the underlying silicon oxide film 7 has a slightly higher hygroscopic property is of no problem since there is a modified SOG film 8a at the upper layer that has low hygroscopic property and high water resistance. However, upper layer metal, interconnection 14 is adversely affected if silicon oxide film 12 located above modified SOG film 8a becomes more hygroscopic. Silicon oxide film 12 should have a hygroscopic property as low as possible. In the present embodiment, silicon oxide film 12 is formed after implanting ions into organic SOG film 8 to prevent ions from being implanted into silicon oxide film 12. This prevents increase in the hygroscopic property of silicon oxide film 12.

The etching step of forming via hole 13 can be carried out in the atmosphere of a mixture gas of carbon tetrafluoride and hydrogen since no organic component is included in modified SOG film 8a. Therefore, a photo resist, when used as an etching mask, will not be affected in the etching process. This means that modified SOG film 8a masked with the photo resist is not etched. Therefore, a small via hole 13 can be formed accurately.

Furthermore, since modified SOG film 8a includes no organic components, the etching rate of modified SOG film 8a is equal to that of silicon oxide films 7, 11 and 12. Modified SOG film 8a will not shrink in the ashing process of removing the photo resist used as an etching mask. Furthermore, no cracks will be generated in modified SOG film 8a. Generation of a recess in forming via hole 13 can be prevented effectively. Thus, via hole 13 can be sufficiently filled with tungsten plug 14.

As described above, modified SOG film 8a includes no organic components and includes only a slight amount of moisture and hydroxyl group. Also, no cracks are generated after the modification. Therefore, either or both of the underlying silicon oxide film 7 or the overlying silicon oxide film 12 of modified SOG film 8a can be omitted.

Figure 12:
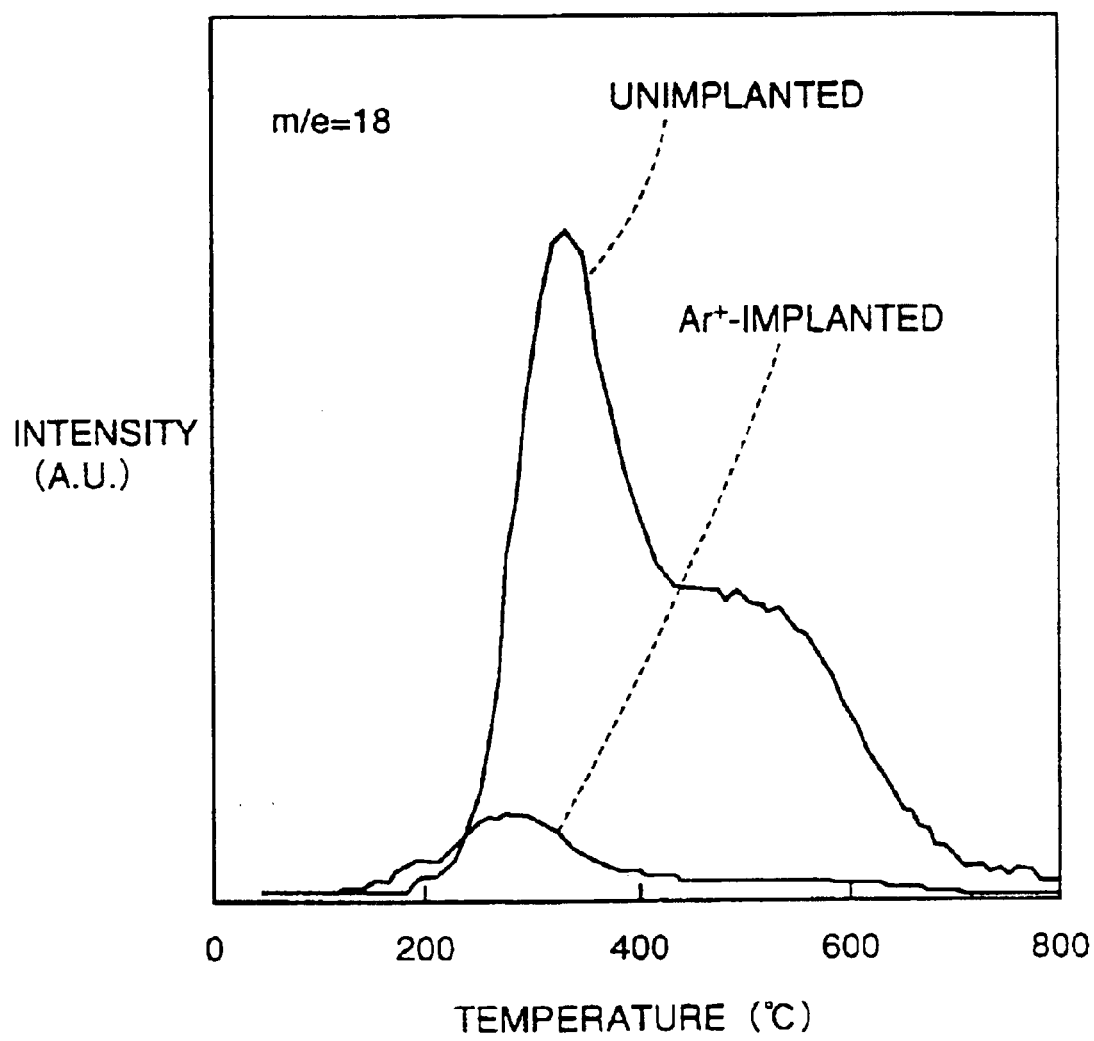

FIG. 12 shows the results evaluated by subjecting organic SOG film 8 (non-processed: unimplanted) and modified SOG film 8a (ion implantation process: $Ar^+$-implanted) respectively subjected to heat treatment for 30 minutes in a nitrogen ambient according to TDS (Thermal Desorption Spectroscopy). The ion implantation conditions are 140 KeV for the acceleration energy and $1 \times 10^{15}$ atoms/cm$^2$ for the dosage.

FIG. 12 shows the amount of desorption for $H_2O$ (m/e= 18). It is appreciated from FIG. 12 that desorption of $H_2O$ (m/e=18) is small for modified SOG film 8a. This means that the moisture and the hydroxyl group included in organic SOG film 8 are reduced by modifying SOG film 8 into modified SOG film 8a by implanting Ar ions into organic SOG film 8.

Figure 13:
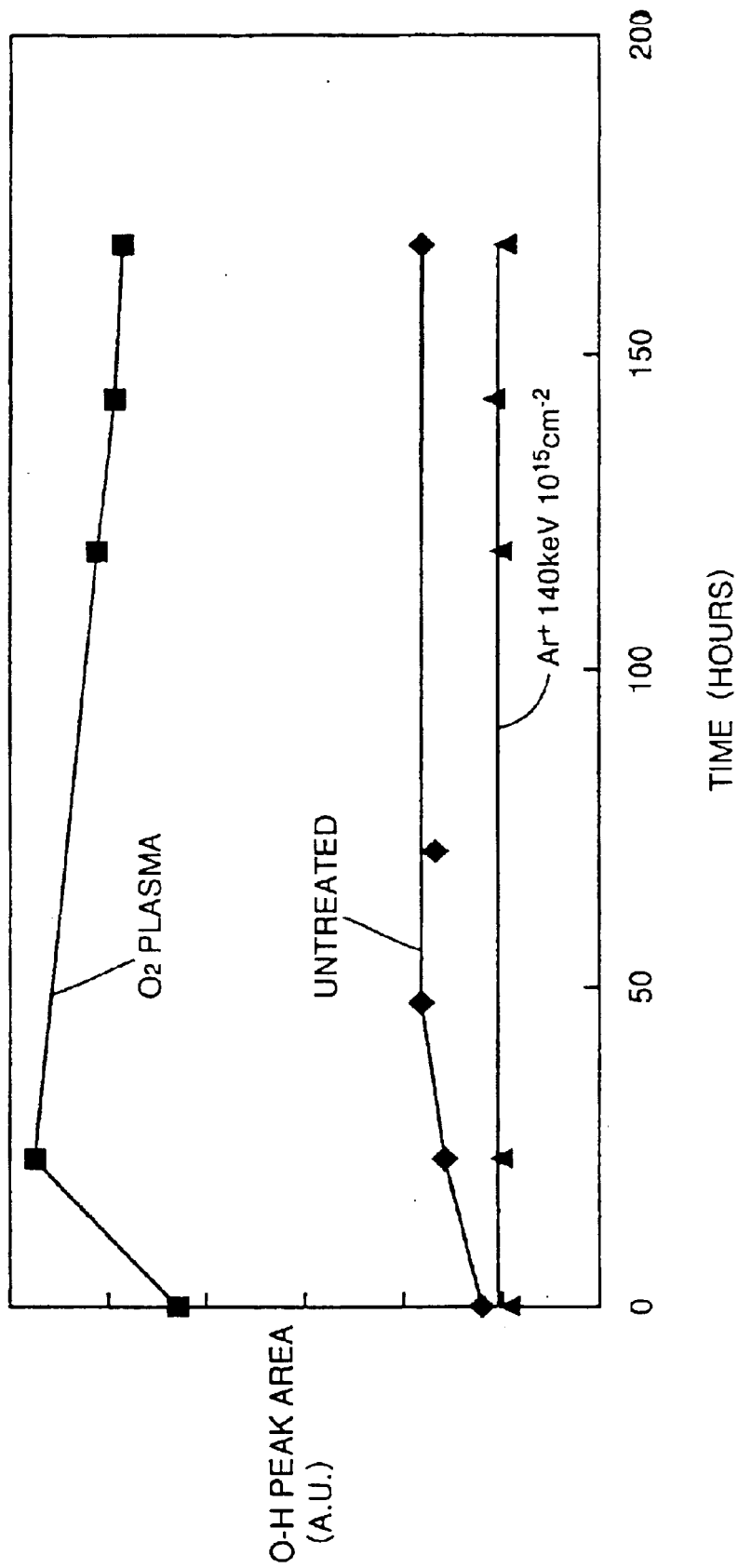

FIG. 13 shows the results of an experiment carried out for the purpose of detecting the hygroscopic property of organic SOG film 8 and modified SOG film 8a. Organic SOG film 8 (UNTREATED), an organic SOG film 8 exposed to oxygen plasma ($O_2$ plasma), and modified SOG film 8a (Ar+) are left in the air in a clean room. The amount of the moisture in each film was indicated by the area strength of the absorption (in the proximity of 3500 cm$^{-1}$) of the O—H group in the infrared absorption spectrum using the FT-IR method (Fourier transform infrared spectroscopy). The ion implantation conditions include the acceleration energy of 140 KeV, and a dosage of $1 \times 10^{15}$ atoms/cm$^2$.

It is appreciated from FIG. 13 that the moisture increases not only before and after the treatment, but also even after 24 hours (1 day) when exposed to oxygen plasma ($O_2$ plasma). In contrast, modified SOG film 8a (Ar$^+$) shows no moisture increase after ion implantation. The increase in moisture is smaller than that of organic SOG film 8 even when left in the air in a clean room. In other words, modified SOG film 8a is less hygroscopic than organic SOG film 8.

Figure 14:
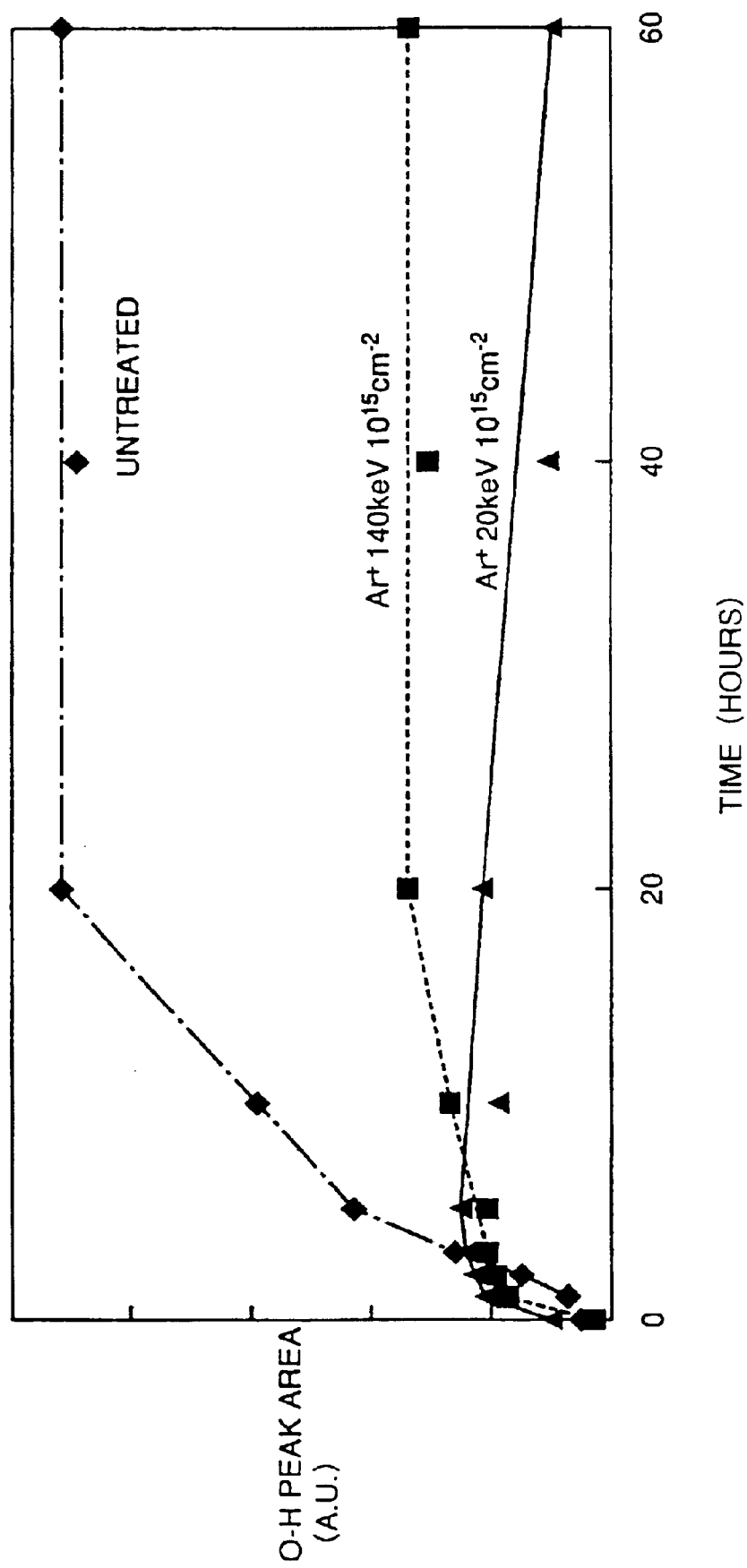

FIG. 14 shows the results of a pressure cooker test (PCT) carried out for the purpose of detecting the moisture permeability of modified SOG film 8a and organic SOG film 8. This pressure cooker test is a humidification test carried out in a saturated steam ambient at 2 atmospheric pressure and 120° C. in the present embodiment. The area intensity of the absorption peak (in the vicinity of 3500 cm$^{31\ 1}$) of the O—H in organic SOG film 8 was obtained and plotted over the PCT time using FT-IR method.

A specimen (Ar$^+$20 KeV) having only the surface modified by ion implantation was prepared and compared with a specimen having the film entirely modified (Ar$^+$140 KeV) and with a specimen that was not modified (organic SOG film 8: untreated). When organic SOG film 8 not modified is subjected to the pressure cooker test, the absorption intensity in the vicinity of 3500 cm$^{-1}$ (of the O—H group) shows a significant increase. In modified SOG film 8a, increase of the absorption intensity in the vicinity of 3500 cm$^{-1}$ (of the O—H group) is small. The increase in the specimen having only the film surface modified is equal to that of the film that is completely modified.

It is understood from the above results that a layer that has moisture permeability suppressed can be formed by implanting ions.

The present invention is not limited to the above-described embodiment, and similar effects and advantages can be obtained by the following implementation.

(1) At least one of modified SOG film 8a and silicon oxide film 12 is etched back entirely, or polished by chemical.mechanical polishing (CMP), for example, after one or all the fourth to sixth steps. This provides the advantage of increasing planarization of the film. In this case, it is preferable to preset the film thickness to a slightly thick value and obtain a predetermined thickness by etching back or by polishing.

(2) A material that prevents the implanted ions from arriving at the AlSiCu alloy in metal interconnection 5 such as a silicon nitride film, refractory metal such as titanium and tungsten, or refractory metal compound is used instead of silicon oxide film 11 (spacer 6). Particularly, the usage of refractory metal and compound thereof is advantageous in that the reliability of the interconnection and the contact is improved due to the conductance thereof.

Titanium is typical of refractory metal. Refractory metal also includes molybdenum, tungsten, tantalum, hafnium, zirconium, niobium, vanadium, rhenium, chromium, platinum, iridium, osmium, and rhodium.

(3) The TiN/Ti layer used as the uppermost layer of metal interconnection 5 can be commonly used as a spacer 6 instead of silicon oxide film 11 (spacer 6). In this case, the TiN/Ti layer must be set to a film thickness that sufficiently prevents ions from arriving at the AlSiCu alloy in metal interconnection 5. A single layer of Ti, TiN, W, Wn$_X$ or TiW, or a multilayer thereof can be used instead of the TiN/Ti layer.

(4) Ions are implanted into the inorganic SOG film used as an alternative to organic SOG film 8. In this case, the moisture and hydroxyl group included in the inorganic SOG film can be reduced.

(5) A silicon oxide film can be used that is formed other than by plasma CVD (atmospheric pressure CVD, low pressure CVD, ECR plasma CVD, photo excited CVD, TEOS-CVD, PVD, etc.) instead of the silicon oxide films 7, 11 and 12 formed by plasma CVD.

(6) Although argon ions are employed as the ion to be implanted into organic SOG film 8 in the above-described embodiment, any ion that can modify organic SOG film 8 can be used. Specifically, ions that have relatively small masses such as argon ions, boron ions, nitrogen ions, or phosphorus ions are suitable. The following ions also can be expected to have a competent effect. For example, helium ions, neon ions, krypton ions, xenon ions, and radon ions which are inert gas ions besides argon can be considered. Inert gas is advantageous in that there is no possibility of the elements being adversely affected by ion implantation since inert gas does not react with organic SOG film 8.

Furthermore, element unitary ions of the group III b, IV b, V b, VI b, and VII b other than boron and nitrogen, and compound ions thereof can be used. Particularly, the element unitary ions and compound ions of oxygen, aluminum, sulfur, chlorine, gallium, germanium, arsenic, selenium, bromine, antimony, iodine, indium, tin, tellurium, lead, and bismuth can be used. Particularly, metal element ions can suppress the dielectric constant to a low level of organic SOG film 8 subjected to ion implantation.

Furthermore, element unitary ions of groups IV a, V a, and compound ions thereof can be used. Particularly, element unitary ions of titanium, vanadium, niobium, hafnium, and tantalum, and compound ions thereof can be considered. Since the dielectric constant of the oxides of the element of the groups IV a, V a is high, the dielectric constant of organic SOG film 8 subjected to ion implantation increases. However, this is of no particular problem in practice except for cases where an interlayer insulation film of low dielectric constant is required.

A plurality of the types of the above-described ions can be used in combination. In this case, a further superior effect can be obtained by the synergism of each ion.

(7) In the above-described embodiment, ions are implanted into organic SOG film 8. The present invention is not limited to ions, and a similar effect can be obtained by injecting atoms, electrons, molecules, or particles having kinetic energy. In the present invention, these are generically referred to as "impurities".

(8) The sputtering method is not limited to magnetron sputtering. Diode sputtering, radio frequency sputtering, tetrode sputtering, and the like can be employed.

(9) Reactive ion beam etching (also called RIBE or reactive ion milling) using reactive gas (for example $CCl_4$, $SF_6$) besides the usage of inert gas can be employed for sputtering etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
    forming a first insulation film on a patterned conductive layer on a substrate,
    implanting impurities into and penetrating through said first insulation film, and
    forming an intrusion prevention film to selectively cover said conductive layer and to substantially prevent the impurities implanted through said first insulation film from entering said conductive layer prior to said step of forming said first insulation film.

2. The manufacturing method of a semiconductor device according to claim 1, wherein said intrusion prevention film includes at least one material selected from the group consisting of silicon oxide, silicon nitride, Ti, TiN, W, $WN_X$ and TiW.

3. The method of manufacturing a semiconductor device according to claim 1, further comprising the step of forming a second insulation film on said conductive layer and said intrusion prevention film prior to said step of forming the first insulation film.

4. The method of manufacturing a semiconductor device according to claim 3, wherein said second insulation film includes a film less hygroscopic than said first insulation film.

5. The method of manufacturing a semiconductor device according to claim 1, further comprising the step of forming a third insulation film on said first insulation film after said step of implanting impurities into the first insulation film.

6. The method of manufacturing a semiconductor device according to claim 1, wherein said first insulation film includes silicon oxide containing at least 1 atomic % of carbon.

7. The method of manufacturing a semiconductor device according to claim 1, wherein said first insulation film includes an inorganic SOG film.

8. The method of manufacturing a semiconductor device according to claim 1, wherein said step of introducing impurities is carried out by ion implantation.

9. The method of manufacturing a semiconductor device according to claim 1, wherein said impurities include at least one element selected from the group consisting of argon, boron, nitrogen, and phosphorus.

10. A method of manufacturing a semiconductor device comprising the steps of:
    forming a conductive layer on a substrate,
    forming a film on said conductive layer, said film including at least one material selected from the group consisting of silicon oxide, silicon nitride, Ti, TiN, W, $WN_X$ and TiW, for substantially preventing impurities implanted from above of said conductive layer from intruding into said conductive layer,
    patterning said conductive layer and said intrusion prevention film simultaneously by using a same mask,
    forming a first insulation film on said patterned conductive layer and intrusion prevention film, and
    implanting the impurities into and penetrating through said first insulation film.

* * * * *